United States Patent
Mihalache et al.

(10) Patent No.: US 8,768,678 B1
(45) Date of Patent: Jul. 1, 2014

(54) SCHEDULING PROCESSES IN SIMULATION OF A CIRCUIT DESIGN BASED ON SIMULATION COSTS AND RUNTIME STATES OF HDL PROCESSES

(75) Inventors: Valeria Mihalache, Santa Clara, CA (US); Christopher H. Kingsley, Longmont, CO (US); Jimmy Z. Wang, Saratoga, CA (US); Kumar Deepak, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 282 days.

(21) Appl. No.: 13/245,174

(22) Filed: Sep. 26, 2011

(51) Int. Cl.
*G06F 9/45* (2006.01)
*G06F 9/455* (2006.01)
*G06F 17/00* (2006.01)

(52) U.S. Cl.
USPC ............... 703/14; 703/13; 716/101; 716/103; 717/140; 717/149; 717/151; 717/154

(58) Field of Classification Search
None
See application file for complete search history.

(56) References Cited

U.S. PATENT DOCUMENTS 5,202,975 A * 4/1993 Rasbold et al. ............... 717/151
6,425,124 B1 * 7/2002 Tominaga et al. ............ 717/146

OTHER PUBLICATIONS

Chen et al., Multicore Simulation of Transaction-Level Models Using the SoC Environment, IEEE Design & Test of Computers, May 2011.*
D'Hollander, Worst Case Bounds for Independent Task Scheduling, 1986.*
"Halstead complexity measures", Dated: Apr. 11, 2010, Retrieved: http://web.archive.org/web/20100411044641/http://en.wikipedia.org/wiki/Halstead_complexity_measures[Aug. 22, 2013].*
Huelsbergen et al., Using the Run-Time Sizes of Data Structures to Guide Parallel-Thread Creation, Proceedings of 1994 ACM Conference on Lisp and Functional Programming.*
"Instruction Path Length", Dated: Mar. 19, 2013, Retrieved: http://en.wikipedia.org/wiki/Instruction_path_length.*
Krishnaswamy et al., Automatic Parallelization of Compiled Event Driven VHDL Simulation, IEEE Transactions on Computers, vol. 51, No. 4, Apr. 2002.*
ModelSim SE User's Manual, Published: Aug. 6, 2002.*

* cited by examiner

*Primary Examiner* — Kamini S Shah
*Assistant Examiner* — Michael P Healey
(74) *Attorney, Agent, or Firm* — LeRoy D. Maunu

(57) ABSTRACT

One or more embodiments provide a load balancing solution for improving the runtime performance of parallel HDL simulators. During compilation each process is analyzed to determine a simulation cost based on complexity of the HDL processes. During simulation, processes to be executed in the same simulation cycle are scheduled using the simulation costs computed at compile-time in order to reduce the delay incurred during simulation.

20 Claims, 4 Drawing Sheets

SCHEDULING PROCESSES IN SIMULATION OF A CIRCUIT DESIGN BASED ON SIMULATION COSTS AND RUNTIME STATES OF HDL PROCESSES

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more embodiments generally relate to the simulation of circuit designs.

BACKGROUND

Due to advancements in processing technology, complex integrated circuits (ICs) can be designed at various levels of abstraction. Using a hardware description language (HDL), circuits can be designed at the gate level, the register transfer level (RTL), and higher logical levels. When designing using an HDL, the design is often structured in a modular manner. The designer describes a module in terms of the behavior of a system, the behavior describing the generation and propagation of signals through combinatorial modules from one set of registers to another set of registers. HDLs provide a rich set of constructs to describe the functionality of a module. Modules may be combined and augmented to form even higher level modules.

Prior to implementation, an HDL design can be simulated to determine whether the design will function as required. Wasted manufacturing costs due to faulty design may thereby be avoided. Numerous tools are available for simulating circuit designs including, for example, high-level modeling systems (HLMS) and HDL simulators.

Simulation of an HDL design comprises a compilation phase and a runtime simulation phase. In the compilation phase, HDL source code is input, analyzed, and elaborated, to generate executable simulation code. In the runtime simulation phase, the code generated in the compilation phase is executed by a simulation engine to simulate the design.

From a user perspective, HDL simulators work by compiling the HDL design once, and then executing the compiled design many times during the runtime phase. Therefore, the runtime performance of HDL simulators is of critical importance, and may be more important than compile time performance.

An HDL design is a hierarchy of modules, whose behavior is described by means of HDL processes. When the HDL design is written in the VHDL language, an HDL process corresponds to either a VHDL process, a concurrent signal assignment, or a concurrent assertion. When the HDL design is written in the Verilog language, an HDL process corresponds to either a Verilog always block, or an initial block, or an assign statement, or a gate. Procedure calls may or may not be regarded as HDL processes.

From a hardware point of view, the HDL processes represent hardware that responds to changes in inputs. For example, a change to an output of one circuit may concurrently trigger responses in multiple circuits having inputs coupled to the output. However, due to the sequential nature of most software, the simulation of the processes representing the affected circuits usually takes place sequentially.

HDL simulators schedule execution of HDL statements such that global variables or signals input to the HDL statements are properly updated and race conditions between concurrent HDL statements are avoided. In VHDL, simulation of HDL processes is performed over a number of simulation cycles which may be either time advance cycles or delta cycles. A time advance cycle advances the simulation from a first time period of circuit operation being simulated to the next time period of circuit operation being simulated. A delta cycle is a simulation cycle in which the simulation time at the beginning of the cycle is the same as at the end of the cycle. That is, simulation time is not advanced in a delta cycle. For example, a delta cycle begins with updates to values of signals. Each update may trigger a number of processes which would be concurrently affected if implemented in hardware. The delta cycle ends after the triggered processes complete execution or are postponed by an event scheduling statement such as a wait statement. The HDL processes executed in a delta cycle may be executed in any order because time is not advanced and signals are not updated until the next simulation cycle.

In Verilog, simulation time slots are divided into multiple regions in which events can be scheduled, and the regions are referred to as event scheduling regions. HDL processes scheduled within an event scheduling region, may be executed concurrently in any arbitrary order. However, processes of different event scheduling regions must be scheduled in a correct order so that signals can be properly synchronized and dependencies accounted for.

While envisioned embodiments are applicable to either VHDL and Verilog, for ease of description, the example and embodiments are primarily described herein with reference to VHDL. Reference to a VHDL delta cycle is understood to also refer to an event scheduling region in the Verilog context.

Previous attempts to simulate the HDL processes in parallel using multiple processors may be computationally inefficient due to the costs of synchronizing and communicating between threads of execution. Improper load balancing may also reduce efficiency. Load balancing refers to the distribution of processing tasks among threads so that all threads are kept busy all of the time. If processors are assigned disproportionate amounts of work, the processors may finish assigned work at different times. As a result, one or more processors may remain idle after completing execution of the assigned processes in a simulation cycle while other processors have further work to perform. Previous attempts to simulate the HDL processes in parallel do not address the complexity of the tasks, which affects the time and resources necessary for simulation. Rather, the distribution and order of execution of processes in parallel at runtime is either arbitrary, or depends on the order in which processes were scheduled for execution. As a result, such approaches exhibited excessive synchronizing times caused by an excessive number of processing threads, and idle processing threads caused by inefficient load balancing.

One or more embodiments may address one or more of the above issues.

SUMMARY

One or more embodiments provide a method of simulating a circuit design using a compiled hardware description language (HDL) specification of the circuit design. For each simulation cycle, a set of HDL processes to be executed in the simulation cycle are determined. Each HDL process of the set of HDL processes includes one or more HDL statements to be executed in the simulation cycle. The set of HDL processes are scheduled for execution on two or more process threads as a function of a respective simulation cost associated with each HDL process of the set and a respective runtime state of each HDL process in the simulation cycle. In response to scheduling an HDL process of the set for execution by one of the two or more process threads, the method executes the HDL process in the simulation cycle using the one of the two or more process threads.

In another embodiment, a method for compiling a hardware description language (HDL) specification for simulation of a circuit design is provided. For each HDL statement in the HDL specification, a simulation cost of the HDL statement is determined. For each process of the HDL specification and each delta cycle of the simulation, a respective set of one or more HDL statements to be executed in the respective delta cycle is determined. For each respective set of the one or more HDL statements, the associated simulation costs are summed to determine a simulation cost of the process for the delta cycle. Each HDL statement is compiled into executable simulation code, which is stored along with information descriptive of the simulation cost of each HDL process in each delta cycle.

In yet another embodiment, an article of manufacture is provided. The article is characterized by processor executable instructions. When executed by a processor, the instructions cause the processor to compile an HDL specification. For each HDL statement in the HDL specification, a simulation cost of the HDL statement is determined. For each process of the HDL specification and each delta cycle of the simulation, a respective set of one or more HDL statements to be executed in the respective delta cycle is determined. For each respective set of the one or more HDL statements, the associated simulation costs are summed to determine a simulation cost of the process for the delta cycle. Each HDL statement is compiled into executable simulation code that is stored along with information descriptive of the simulation cost of each HDL process in each delta cycle.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION

In practice, HDL circuit designs typically employ a large number of HDL processes. Simulation may require thousands of HDL processes to be scheduled in a particular simulation cycle. However, the number of threads or processor cores available for use may be limited to a number in the tens or hundreds. Therefore, the problem of determining which HDL processes to simulate in parallel and the order of simulation is significant. Practice has shown that scheduling processes from the event queue at random and executing them in parallel will often provide minimal, if any, performance improvement due to the overhead of thread switching and the overhead of synchronization and communication between processes.

One or more embodiments provide a load balancing solution for significantly improving the runtime performance of parallel HDL simulators. During compilation, each process is analyzed to determine a simulation cost based on complexity of the HDL processes. During simulation, processes to be executed in the same simulation cycle are scheduled using the simulation costs computed at compile-time in order to reduce the delays due to thread switching and thread idleness. The additional compilation time imposed by this approach is offset by gains in runtime performance since HDL designs are typically simulated many times following compilation.

There are two major groups of HDL statements: event scheduling statements and compute statements. Event scheduling statements are statements that effect scheduling events on the event queue. Examples of event scheduling statements include delayed signal assignments and statements that wait for a determined amount of time. Compute statements are statements that perform pure computation when executed, i.e., they do not schedule events on the event queue. Compute statements include signal and variable assignments, if statements, for loops, etc.

It is recognized that during simulation, a process may be executed over several simulation cycles. For example, if a wait statement is encountered during simulation, continued execution of the process is postponed until a later simulation cycle after the wait statement has expired.

In one or more embodiments, processes are analyzed during compilation to group HDL statements of each respective process that are executed together in the same delta cycle and determine a simulation cost for each group. When processes to be executed in the same simulation cycle are scheduled at simulation runtime, the simulator determines, for each process, which group of HDL statements will be executed in the simulation cycle and retrieves for each process a respective simulation cost corresponding to the group of HDL statements of the process that will be executed in the simulation cycle. The processes are then scheduled according to the retrieved simulation costs in order to reduce the delays due to thread switching and thread idleness.

Figure 1:
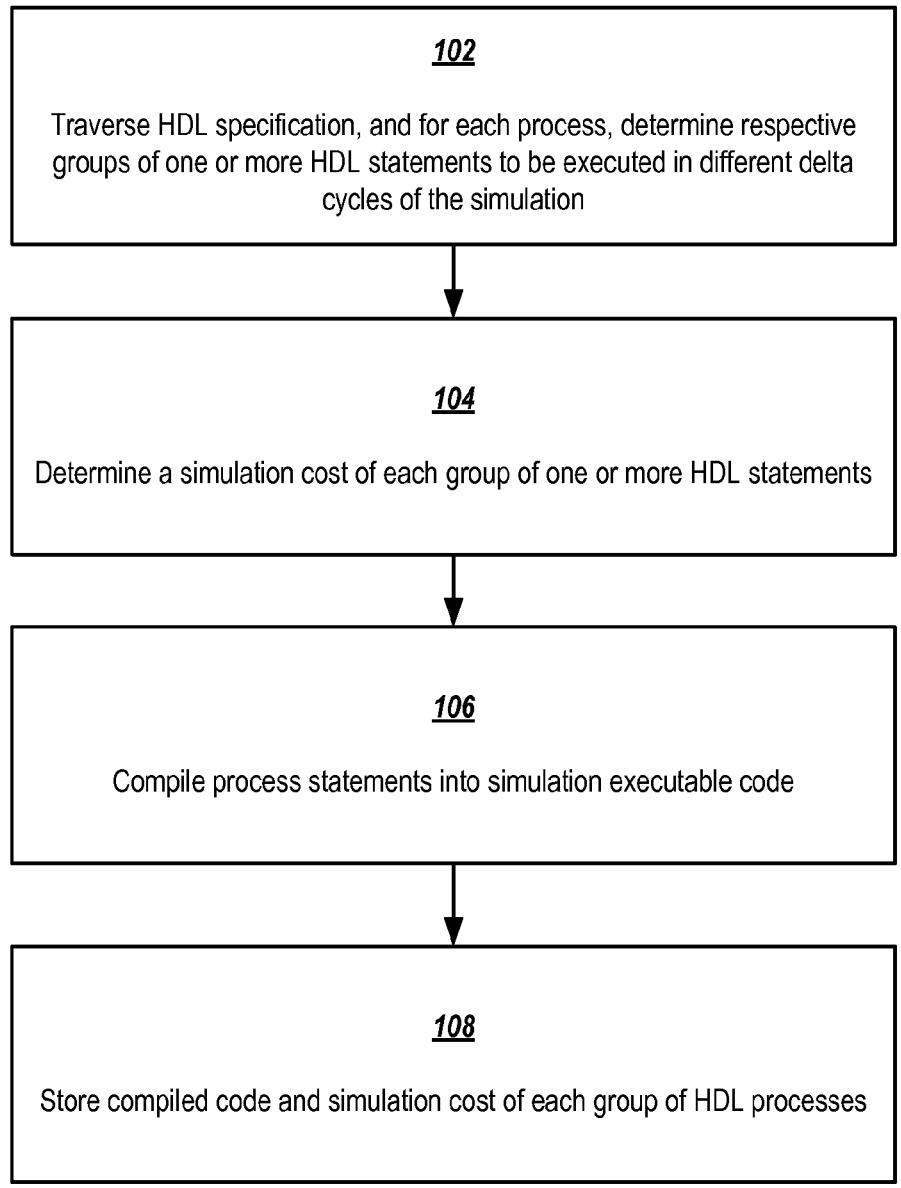
FIG. 1 shows a process of determining simulation cost during HDL compilation.

FIG. 1 shows a process of determining simulation cost during HDL compilation. The HDL specification is traversed and for each process, groups of HDL statements to be executed in different simulation cycles are determined at block 102. A simulation cost of each group of HDL statements is determined at block 104. The HDL statements are compiled into simulation executable code at block 106. The compiled code and simulation cost of each group of HDL statements are stored at block 108. It is understood that the compiled code and simulation cost may be stored in a number of different formats that may be accessible by a simulator at runtime. For example, in one implementation, the simulation cost of each group of HDL statements may be stored as meta-data in a data file that is used to store the compiled executable code. In another implementation, the simulation cost of each group of HDL statements and compiled executable code may be stored in separate files.

The simulation cost of each group of HDL statements may depend on the complexity and number of HDL statements included in the group. In one or more embodiments, the simulation cost of a particular event scheduling statement is a constant (cost_scheduling), which is defined as an estimate of the cost of scheduling an event on the event queue. In practice, cost_scheduling depends on the specifics of the simulator implementation, but is a constant that can be determined for each HDL simulator implementation. The cost of a wait or delay statement is equal to cost_scheduling. The simulation cost of a delayed signal assignment, such as shown by VHDL statement example_signal<=expression after 5 ns, would be equal to the simulation cost(expression)+cost_scheduling.

Compute statements require a certain amount of processing time and resources to execute the statement in the simulation engine. The simulation cost of a compute statement may be represented by any of a number of different metrics. For example, in one implementation, the simulation cost of a statement can be represented as the number of machine instructions necessary to execute the statement. In another implementation, simulation cost can be approximated by the number of operands in the HDL statement.

The cost of conditional statements may not be accurately determined at compile time. For instance, a process may contain the following conditional statement:

if (condition) then
        statement_then__1;
        statement_then__2;
        . . .
        statement_then_n;
    else
        statement_else__1;
        statement_else__2;
        . . .
        statement_else_k;
    end if;

If condition is true, then the cost of this if statement will be cost(condition)+cost(statement_then__1)+ . . . +
        cost(statement_then__n).

If condition is false, then the cost of this if statement will be cost(condition)+cost(statement_else__1)+ . . . +
        cost(statement_else__k).

However, assuming that the probability of the condition to be true is the same as the probability for the condition to be false, then the cost of this conditional if statement can be estimated as the sum of both possible costs scaled by their probability of occurrence (i.e. 0.5). The resulting cost becomes {cost(condition)+cost(statement_then__1)+ . . . +
        cost(statement_then__n)+cost(condition)+
        cost(statement_else__1)+ . . . +
        cost(statement_else__k)}/2.

As described above, when a process is executed during simulation, different groups of HDL statements may be executed in different simulation cycles. The simulation cost for a particular group is equal to the sum of the costs of executing its statements, as given by the following equation:

cost(hdl_block)=$\Sigma_{stmt\ in\ hdl\_block}$cost(stmt)

Example 1 shows a portion of VHDL code with an HDL process that includes three event scheduling statements and twelve compute statements. During simulation, the event scheduling statements will cause the process to be processed over three simulation cycles. In a first simulation cycle, HDL statements in statement_region1 at lines 4-5 will be executed, followed by the event scheduling statement at line 6, in a second simulation cycle, HDL statements in statement_region2 at lines 7-16 will be executed, followed by the event scheduling statement at line 17, and in a third simulation cycle, HDL statements in statement_region3 at lines 18-20 will be executed, followed by the event scheduling statement at line 21.

```
1     my_process : process is
2        variable v : bit := '0';3
3     begin 4     procedure_call( );   -- st1                          --statement_region1
5     report "state1" severity note;   -- st2              ↓
6     wait for 2 ns; -- event_scheduling_statement1
7     sig1 <= "11011011";   --st3                          --statement_region2
8     v := complex_expression1;   -- st4                   ↓
9     if (v = '1') then        -- st5
10       report "v1 ok" severity note;   -- st5_1
11    else
12       assert (0) report "Unexpected result"
13          severity note;          -- st5_2
14    end if;
15    clock <= not(clock);    -- st6
16    report "state2" severity note;   -- st7
17    wait for 3 ns; -- event_scheduling_statement2
18    sig2 <= "1101";   --st8                              --statement_region3
19    v := complex_expression2;   -- st9                   ↓
20    report "state3" severity note;   -- st10
21    wait;   -- event_scheduling_statement3

22    end process;
```

If the procedure call procedure_call( ) also contains event scheduling statements, then the process should be partitioned further according to the compute statement regions and event scheduling statements included in procedure_call( ) and according to the compute statement regions and event scheduling statements included in any other procedure that might be called therein.

As described above, one can see that an HDL process can be in different states during its execution. Each state corresponds to a different simulation cycle. The cost of executing the process in a particular delta cycle depends on the current state of the process. As such, the process in Example 1, has three runtime states: state1, state2, and state3. State1 is defined by the compute statements in statement_region__1, followed by the event scheduling__1 statement. State2 is defined by the compute statements in statement_region__2, followed by the event scheduling 2 statement. State3 is defined by the compute statements in statement_region__3, followed by the event scheduling 3 statement.

The cost of the process in state1 is (C1+cost_scheduling), the cost of the process in state2 is (C2+cost_scheduling), and the cost of the process in state3 is (C3+cost_scheduling), where C1 is the cost of executing the HDL statements at lines 4-5, C2 is the cost of executing the HDL statements at lines 7-16, and C3 is the cost of executing the HDL statements at lines 18-20.

In the case of a process with no event scheduling statements or with one event scheduling statement as the last statement in the process, the process can be regarded in this framework as an HDL process with only one group of HDL statements.

By determining a simulation cost for each HDL statement, and summing the simulation costs for each group of HDL statements, a simulation cost table may be constructed during compilation that may be used to efficiently schedule processes during runtime. It is to be noted that while this table can be built at compile time, only at runtime will the exact state the process is in be known.

Figure 2:
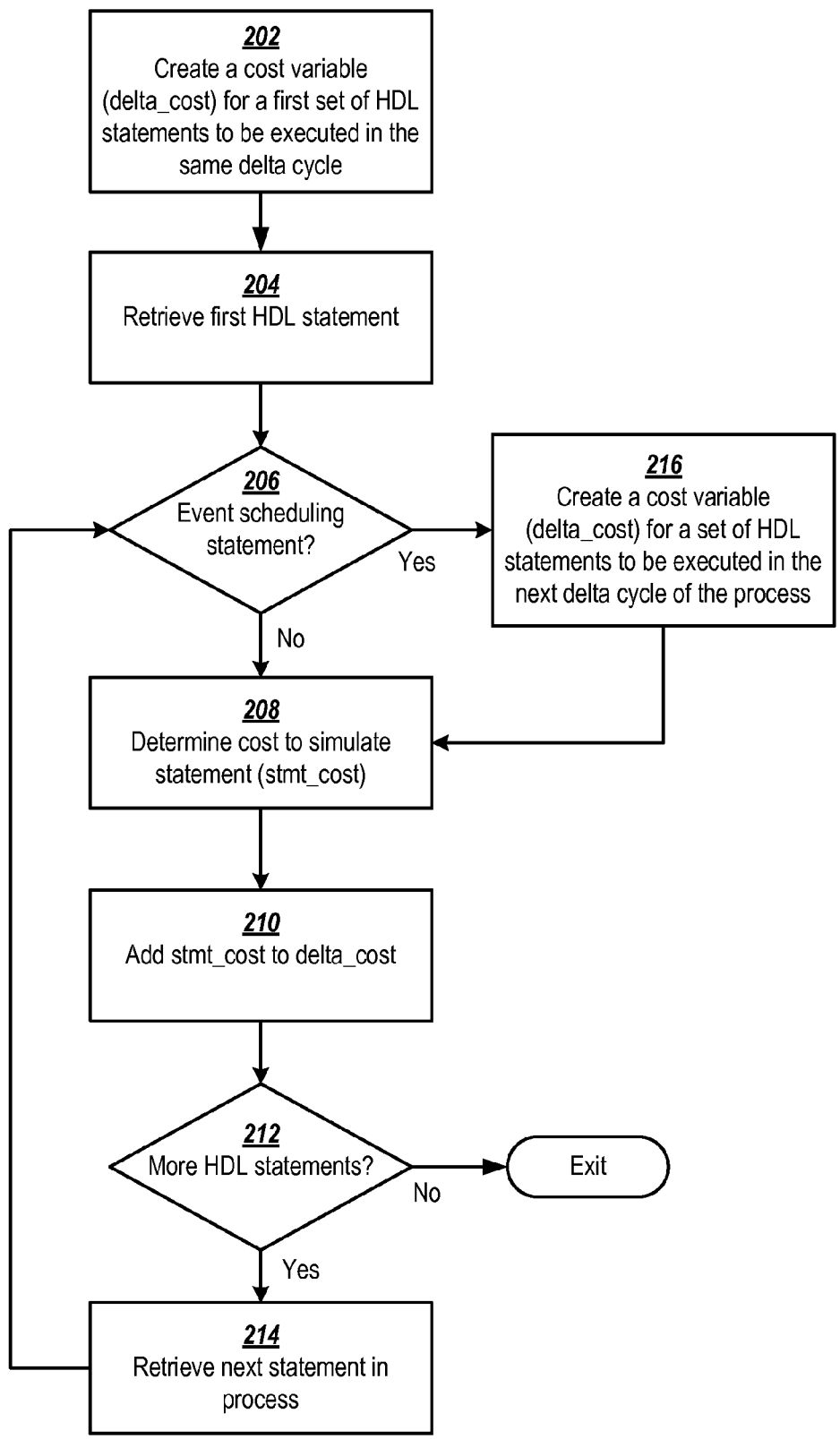
FIG. 2 shows a process of determining simulation cost for each sequence of process statements to be executed in a delta cycle.

As may be observed in Example 1, the groups of HDL statements may be identified by event scheduling statements, which separate the groups of HDL statements. In one or more embodiments, HDL statements may be grouped and analyzed to determine a simulation cost for each group while traversing the HDL design during elaboration performed by the compiler. FIG. 2 shows a process of identifying groups of HDL statements to be executed in a delta cycle during simulation and determining a simulation cost for each group. While traversing an HDL process, simulation costs are calculated for encountered HDL statements as described above. The simulation costs are summed into respective simulation costs for the groups. Whenever an event scheduling statement is encountered, the accumulated value is stored as the simulation cost of the group and the accumulated value is reset to zero.

A cost variable (delta_cost) is created at block 202 for each group of HDL statements of a process that are to be executed in a first delta cycle. For each HDL statement encountered at blocks 204 and 214, the statement is analyzed to determine if the statement is an event scheduling statement at block 206. If the statement is not an event scheduling statement, a cost to simulate the statement (stmt_cost) is determined at block 208 and is added to delta_cost at block 210.

If and when an event scheduling statement is encountered at block 206, delta_cost holds the total simulation cost to simulate the process in that particular delta cycle. A new cost variable delta_cost is created at block 216. The new cost variable is used to accumulate and store the simulation cost of statements in the next group of HDL statements of the process that are to be executed in the next delta cycle. The end of a group is determined when an event scheduling statement is encountered at block 206 or the end of the process is encountered at block 212.

For ease of illustration, the flow depicted in FIG. 2 does not show all the steps to identify and sum conditional statements as described above. It will be recognized that when a conditional statement is encountered, the process would be traversed until the end of the conditional statement is encountered, a simulation cost of the conditional statement would be calculated using the methodology described above, and the simulation cost of the conditional statement would be added to delta_cost at block 210. The flow would then continue to decision block 212 as described above.

During simulation, several processes may be executed in the same delta cycle. These processes may be executed in any order without affecting the simulation result. However, thread assignment and order of execution can significantly affect simulation runtime. For example, suppose three HDL processes P1, P2, P3 are to be executed in the same delta cycle using two processing threads. In their current respective states, process P1 has a simulation cost of 5, process P2 has a simulation cost of 20, and process P3 has a simulation cost of 70.

In one possible scenario, the process P1 may be executed on thread1 and process P2 on thread2. Thread1 (cost=5) will complete its execution before thread2 (cost=20). Process P3 will be executed by either thread2, or by thread1. Before advancing to the next delta cycle/event scheduling region, the simulation kernel has to execute all processes scheduled for the current delta cycle/event scheduling region. If process P3 is executed on thread2, then thread1 will be idle for the time period between when P1 completes and when P2 and P3 complete. Assuming the costs are commensurate with units of processing time, the idle time will be 20+70−5=85 units of time, and the simulation time of the delta cycle will take 20+70=90 units of time to complete. If process P3 were instead executed by thread1 after P1 completes, then thread2 would be idle for the time it takes thread1 to complete P1 and P3 in excess of the time it takes to complete P2 (5+70−20=55 units of time), and the simulation time of the delta cycle will take 5+70=75 units of time to complete. In this scenario, the latter choice leads to better performance results than the former one.

In another possible scenario, P3 can be executed on thread1, and P1 and P2 executed on thread2. When thread2 completes executing P1, P2 is simulated on thread2. The load on thread1 is 70 units, and the time to sequentially complete P1 and P2 on thread2 is 5+20=25 units. Before advancing to the next time slot and/or event scheduling region, the simulation kernel has to execute all processes scheduled for the current event scheduling region. Therefore, thread2 will be idle for the time required to complete P3 in excess of the time to sequentially process P1 and P2 (70−(5+20)=45 units). The current time slot would take 70 units of time to complete.

The above example illustrates that the order in which processes are executed at runtime may significantly affect runtime performance. Since a real-life simulation may include thousands or even millions of time slots and event scheduling regions that have to be processed, optimizing the duration and idleness of the time slots becomes of critical importance.

In one or more embodiments, a simulator uses simulation costs determined during compilation to schedule processes executed in each simulation cycle in an order that reduces thread idleness during simulation. Processes to be executed in a simulation cycle are sorted according to the simulation costs corresponding to the current state of the processes, and the processes are scheduled in a sorted order from greatest simulation cost to least simulation cost. Because the process with the next largest simulation cost is scheduled whenever a processing thread becomes available, the shortest processing time and the least idle thread time is guaranteed.

In addition to the order in which processes are scheduled, simulation time may be significantly affected by the number of processing threads used to execute the processes. In most cases, if each process whose cost is low is executed in the simulation cycle using a respective processing thread, the simulation will be slower than if several processes were run on one thread. The delay in the parallel simulation results from the costs involved with scheduling threads in a processing kernel of an operating system. More precisely, a parallel simulation should account for the operating system cost of thread switching, since basic operations involved in thread switching and synchronization take time. In addition, the event queue of processing threads will need to be locked for scheduling processes by different threads. The cost of locking and unlocking the event queue should be accounted for. Therefore, the processes that are executed in parallel should be complex enough to offset these costs. Otherwise, the simulation may be slower than if several processes were executed on a single thread.

In a typical HDL design, a significant percentage of the HDL processes are low cost. Examples include Verilog assign statements, Verilog gates, and VHDL concurrent signal assignments. Therefore, the number of processing threads used to execute low cost processes may have a significant impact on the overall simulation performance.

In one or more embodiments, the simulator determines a number of processing threads used to execute the processes, based on the corresponding simulation costs to avoid unnecessary overhead resulting from scheduling of processing threads in a kernel of a computer system running the simulation. A cost threshold (cost_threshold) is determined and indicates a minimum simulation cost that processes must have in order to be assigned a respective thread for execution. The cost_threshold may take into account the hardware architecture used for implementing the algorithm and the performance overhead due to thread switching and the locking/unlocking of the event queue with a mutex. The cost_threshold may be determined experimentally, such that the performance of executing in parallel any two processes of cost greater than or equal to cost_threshold is better than the performance of executing the two processes sequentially.

Figure 3:
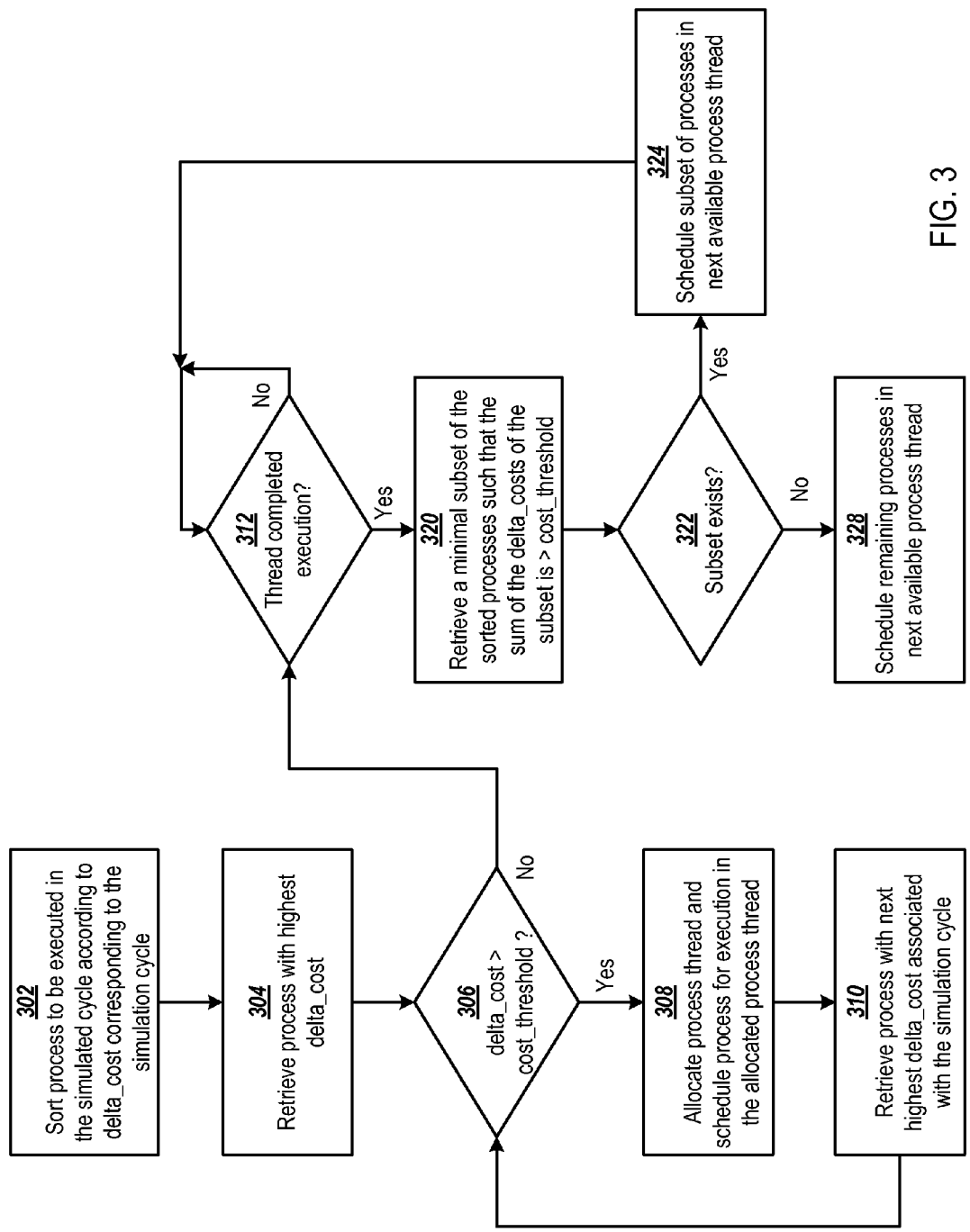
FIG. 3 shows a process of scheduling HDL processes for simulation according to simulation cost.

FIG. 3 shows a process of scheduling HDL processes for simulation according to simulation cost. Processes to be executed in the current simulation cycle are sorted according to respective simulation cost associated with the current state of each process at block 302 (delta_cost). The delta_cost may be determined during compilation using the flow shown in FIG. 2. Processes are retrieved and scheduled at blocks 304, 310, and 320 in sorted order starting with the process having the highest delta_cost associated with the current state at block 304. For individual retrieved processes having a delta_cost greater than the cost_threshold at decision block 306, a process thread is allocated and the process is scheduled for execution in the allocated thread at block 308. Processes having a delta_cost less than the cost_threshold are scheduled as the process threads, which are used to schedule the processes having a delta_cost greater than the cost_threshold, become available after completing execution of the previously scheduled processes. When a thread completes execution of a scheduled process at decision block 312, unscheduled processes are selected in decreasing order of their costs, and grouped together such that the sum of the delta_costs associated with the current simulation cycle is greater than the cost threshold at block 320.

If such a subset exists at decision block 322, the unscheduled processes in the subset of unscheduled processes are scheduled for execution by the available thread at block 324. The unscheduled processes are grouped and scheduled as process threads become available until no subset exists that has a sum of delta_costs greater than the cost_threshold. Once no subset exists that has a sum of the delta_costs greater than the cost_threshold (decision block 322), the remaining unscheduled processes are then scheduled in the available process thread at block 328.

Figure 4:
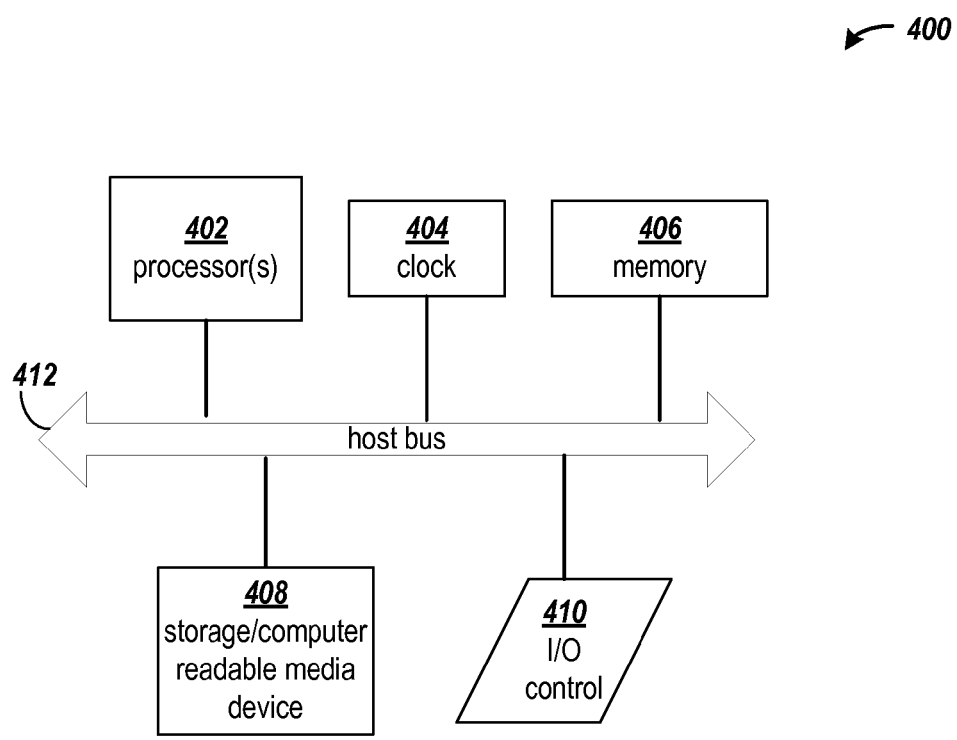
FIG. 4 shows a computing architecture that may be used to implement compilation and simulation processes.

FIG. 4 shows a block diagram of an example computing arrangement that may be configured to implement the compilation and/or simulation processes described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 400 includes one or more processors 402, a clock signal generator 404, a memory unit 406, a storage unit 408, and an input/output control unit 410 coupled to a host bus 412. The arrangement 400 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 402 may be one or more general purpose processors, or a combination of one or more general purpose processors and suitable co-processors, or one or more specialized processors (e.g., RISC, CISC, pipelined, etc.).

The memory arrangement 406 typically includes multiple levels of cache memory, and a main memory. The storage arrangement 408 may include local and/or remote persistent storage such as provided by magnetic disks (not shown), flash, EPROM, or other non-volatile data storage. The storage unit may be read or read/write capable. Further, the memory 406 and storage 408 may be combined in a single arrangement.

The processor arrangement 402 executes the software in storage 408 and/or memory 406 arrangements, reads data from and stores data to the storage 408 and/or memory 406 arrangements, and communicates with external devices through the input/output control arrangement 410. These functions are synchronized by the clock signal generator 404. The resource of the computing arrangement may be managed by either an operating system (not shown), or a hardware control unit (not shown).

The embodiments may be applicable to a variety of systems for HDL simulation. Other aspects and embodiments will be apparent from consideration of the specification. It is intended that the specification and illustrated embodiments be considered as examples only, with a true scope of the embodiments being indicated by the following claims.

What is claimed is:

1. A method of simulating a circuit design using a compiled hardware description language (HDL) specification of the circuit design, the method comprising, for each simulation cycle:
   determining a set of HDL processes to be executed in the simulation cycle, each HDL process of the set of HDL processes including one or more compiled HDL statements of the compiled HDL specification to be executed in the simulation cycle;
   scheduling the set of HDL processes for execution on two or more process threads as a function of a respective simulation cost associated with each HDL process of the set and a respective runtime state of each HDL process in the simulation cycle, wherein the scheduling includes determining associated simulation costs of HDL statements in each HDL process of the set;
   determining a resulting simulation cost of a conditional statement in an HDL process of the set, the conditional statement conditioning execution during simulation between a first set of one or more statements and a second set of one or more statements based on whether a condition of the conditional statement evaluates to true or false, and said resulting simulation cost of the conditional statement being determined as a sum of a first term and a second term, wherein:
      the first term is a sum, scaled by a probability of the condition evaluating to true, of a simulation cost for the conditional statement plus a simulation cost of the first set of one or more statements; and
      the second term is a sum, scaled by a probability of the condition evaluating to false, of the simulation cost for the conditional statement plus a simulation cost of the second set of one or more statements; and
   executing, on a processor, an HDL process of the set in the simulation cycle using one of the two or more process threads in response to scheduling the HDL process of the set for execution by the one of the two or more process threads.

2. The method of claim 1, wherein the scheduling of the set of HDL processes for execution includes:
   sorting the HDL processes of the set into a sorted order according to the respective simulation costs associated with each HDL process of the set for the simulation cycle; and
   scheduling the HDL processes of the set in the sorted order.

3. The method of claim 2, wherein the scheduling of the set of HDL processes for execution further includes:
   determining a subset of the set of HDL processes, wherein for each HDL process of the subset the associated simulation cost is greater than a cost threshold; and
   scheduling each HDL process of the subset for execution on a respective process thread of the two or more process threads.

4. The method of claim 1, wherein the scheduling of the set of HDL processes for execution includes:
   determining a subset of the set of HDL processes, wherein for each HDL process of the subset the associated simulation cost is greater than a cost threshold; and
   scheduling each HDL process of the subset for execution on a respective process thread of the two or more process threads.

5. The method of claim 4, wherein the scheduling of the set of HDL processes for execution further includes, in response to a given process thread of the two or more process threads completing execution of a scheduled HDL process of the subset of the HDL processes and the set of HDL processes including one or more unscheduled HDL processes to be executed in the simulation cycle:
   scheduling at least one HDL process of the one or more unscheduled HDL processes for execution using the given process thread; and
   executing the at least one HDL process of the one or more unscheduled HDL processes using the given process thread.

6. The method of claim 5, further comprising scheduling the one or more unscheduled HDL processes in descending sorted order according to the respective associated simulation costs.

7. The method of claim 5, wherein the scheduling of the at least one HDL process of the one or more unscheduled HDL processes includes scheduling a plurality of the one or more unscheduled HDL processes for which a combination of the respective associated simulation costs exceed the cost threshold.

8. The method of claim 4, wherein the cost threshold is equal to a value such that for each combination of two processes of the subset of HDL processes, a time needed to execute the combination of the two processes in parallel is less than a time needed to execute the combination of the two processes sequentially.

9. The method of claim 8, wherein the time needed to execute the combination of the two processes in parallel and the time needed to execute the combination of the two processes sequentially each include performance overhead due to process thread switching used to execute the combination of the two processes.

10. A method for compiling a hardware description language (HDL) specification for simulation of a circuit design, the method comprising:
    determining, using one or more processors, an associated simulation cost of each HDL statement in the HDL specification, wherein the determining the associated simulation cost includes:
       determining a resulting simulation cost of a conditional HDL statement, the conditional statement conditioning execution during simulation between a first set of one or more statements and a second set of one or more statements based on whether a condition of the conditional statement evaluates to true or false, and said resulting simulation cost of the conditional statement being determined as a sum of a first term and a second term, wherein:
          the first term is a sum, scaled by a probability of the condition evaluating to true, of a simulation cost for the conditional statement plus a simulation cost of the first set of one or more statements; and
          the second term is a sum, scaled by a probability of the condition evaluating to false, of the simulation cost for the conditional statement plus a simulation cost of the second set of one or more statements;
    for each process of the HDL specification:
       determining respective sets of one or more HDL statements for execution in respective delta cycles of the simulation; and
       determining, for each one of the respective sets of the one or more HDL statements, an associated simulation cost for the respective delta cycle as a sum of the associated simulation costs of the one or more HDL statements in the respective set;
    compiling each HDL statement into executable simulation code; and
    storing the executable code and information descriptive of the simulation cost of each HDL process in each delta cycle.

11. The method of claim 10, wherein the determining of the respective sets of one or more HDL statements includes identifying groups of HDL statements of the process that are separated by one or more event scheduling statements.

12. The method of claim 10, wherein the determining of the associated simulation cost of each HDL statement includes determining a number of operands contained in each HDL statement.

13. The method of claim 10, wherein the determining of the associated simulation cost of each HDL statement includes determining a number of machine instructions necessary to execute each HDL statement.

14. The method of claim 10, further comprising, for each process of the HDL specification, storing in a memory, the associated simulation cost of each respective set of HDL statements to be executed in each delta cycle.

15. The method of claim 10, wherein, for each process of the HDL specification, the associated simulation cost of each respective set of HDL statements to be executed in each delta cycle is stored as meta-data in a data file used to store the compiled executable code.

16. An article of manufacture, comprising:
    a non-transitory processor-readable medium with an executable program stored thereon, wherein the program instructs a processor to perform the following:
    compiling a hardware description language (HDL) specification by:
       determining an associated simulation cost of each HDL statement in the HDL specification, wherein the determining the associated simulation cost includes:
          determining a resulting simulation cost of a conditional HDL statement, the conditional statement conditioning execution during simulation between a first set of one or more statements and a second set of one or more statements based on whether a condition of the conditional statement evaluates to true or false, and said resulting simulation cost of the conditional statement being determined as a sum of a first term and a second term, wherein:
the first term is a sum, scaled by a probability of the condition evaluating to true, of a simulation cost for the conditional statement plus a simulation cost of the first set of one or more statements; and
the second term is a sum, scaled by a probability of the condition evaluating to false, of the simulation cost for the conditional statement plus a simulation cost of the second set of one or more statements;

for each process of the HDL specification:
determining respective sets of one or more HDL statements for execution in respective delta cycles of the simulation; and
determining, for each one of the respective sets of the one or more HDL statements, an associated simulation cost for the respective delta cycle as a sum of the associated simulation costs of the one or more HDL statements in the respective set;
generating executable simulation code for each HDL statement; and
storing the executable code and information descriptive of the simulation cost of each HDL process in each delta cycle to produce a compiled HDL specification.

17. The article of manufacture of claim 16, wherein the program further instructs the processor, in response to a user command, to simulate the compiled HDL specification by performing operations for each simulation cycle including:
determining a set of HDL processes of the HDL specification to be executed in the simulation cycle, each HDL process of the set of HDL processes including one or more compiled HDL statements of the compiled HDL specification to be executed in the simulation cycle;
scheduling the set of HDL processes for execution on two or more process threads as a function of a respective simulation cost associated with each HDL process of the set of HDL processes and a respective runtime state of each HDL process in the simulation cycle; and
executing, in response to scheduling an HDL process of the set of HDL processes for execution by one of the two or more process threads, the HDL process of the set of HDL processes in the simulation cycle using the one of the two or more process threads.

18. The article of manufacture of claim 17, wherein the scheduling of the set of HDL processes for execution includes:
determining a subset of the set of HDL processes, wherein for each HDL process of the subset the associated simulation cost is greater than a cost threshold; and
scheduling each HDL process of the subset for execution on a respective process thread of the two or more process threads.

19. The article of manufacture of claim 17, wherein the scheduling of the set of HDL processes for execution includes:
sorting the HDL processes of the set into a sorted order according to the respective simulation costs associated with each HDL process of the set for the delta cycle; and
scheduling the HDL processes of the set in the sorted order.

20. The article of manufacture of claim 19, wherein the scheduling of the set of HDL processes for execution further includes:
determining a subset of the set of HDL processes, wherein for each HDL process of the subset associated simulation cost is greater than a cost threshold; and
scheduling each HDL process of the subset for execution on a respective process thread of the two or more process threads.

* * * * *